United States Patent
Lagarde

(10) Patent No.: US 8,054,930 B2
(45) Date of Patent: Nov. 8, 2011

(54) CLOCK RECOVERY CIRCUIT

(75) Inventor: Jean-Pierre Lagarde, Laval (FR)

(73) Assignee: STMicroelectronics S.A., Montrouge (FR)

( * ) Notice: Subject to any disclaimer, the term of this patent is extended or adjusted under 35 U.S.C. 154(b) by 1219 days.

(21) Appl. No.: 10/841,705

(22) Filed: May 7, 2004

(65) Prior Publication Data
US 2004/0223578 A1 Nov. 11, 2004

(30) Foreign Application Priority Data

May 7, 2003 (FR) .................................... 03 05565

(51) Int. Cl.
*H03D 3/24* (2006.01)
(52) U.S. Cl. ......... 375/376; 375/373; 375/371; 375/354
(58) Field of Classification Search .................... 375/376
See application file for complete search history.

(56) References Cited

U.S. PATENT DOCUMENTS

| | | | |
|---|---|---|---|
| 4,596,964 A * | 6/1986 | Quaranta | 331/25 |
| 5,181,115 A * | 1/1993 | Flamm et al. | 348/537 |
| 5,281,926 A * | 1/1994 | Rabii | 331/14 |
| 5,600,379 A * | 2/1997 | Wagner | 348/497 |
| 5,699,392 A | 12/1997 | Dokic | |
| 5,764,965 A * | 6/1998 | Poimboeuf et al. | 713/400 |
| 5,806,488 A * | 9/1998 | Imberg | 123/406.63 |
| 5,825,213 A * | 10/1998 | Barrett et al. | 327/105 |
| 5,881,114 A | 3/1999 | Moon | |
| 6,072,369 A | 6/2000 | Dhong et al. | |
| 6,092,097 A * | 7/2000 | Suzuoka | 709/201 |
| 6,114,888 A * | 9/2000 | Walley | 327/157 |
| 6,175,385 B1 | 1/2001 | Kohiyama et al. | |
| 2005/0197064 A1* | 9/2005 | Ibrahim et al. | 455/41.2 |

FOREIGN PATENT DOCUMENTS

| | | |
|---|---|---|
| EP | 0 836 282 | 4/1998 |
| WO | WO 01/22736 | 3/2001 |

OTHER PUBLICATIONS

French Preliminary Search Report dated Dec. 18, 2003 for French Application No. 0305565.

* cited by examiner

*Primary Examiner* — Shuwang Liu
*Assistant Examiner* — Michael Neff
(74) *Attorney, Agent, or Firm* — Lisa K. Jorgenson; Stephen Bongini; Fleit Gibbons Gutman Bongini & Bianco P.L.

(57) ABSTRACT

A circuit is provided for clock recovery. The circuit includes a reference extraction unit for extracting from a datastream time references defining a reference time base, and a digital Phase Locked Loop including a first programmable counter in the guise of a digitally controlled oscillator for overseeing an output time base, a second programmable counter in the guise of a loop divider for overseeing a loop time base, and a dedicated processor capable of executing a program including a first software module in the guise of a phase comparator for comparing values of the loop and reference time bases and generating a loop error, and a second software module in the guise of a loop filter for producing an adaptation value of an increment value of the first programmable counter from the loop error. Also provided are a user terminal and a method for clock recovery.

19 Claims, 3 Drawing Sheets

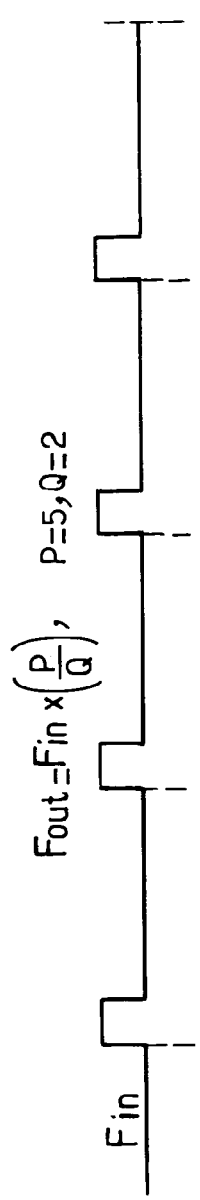
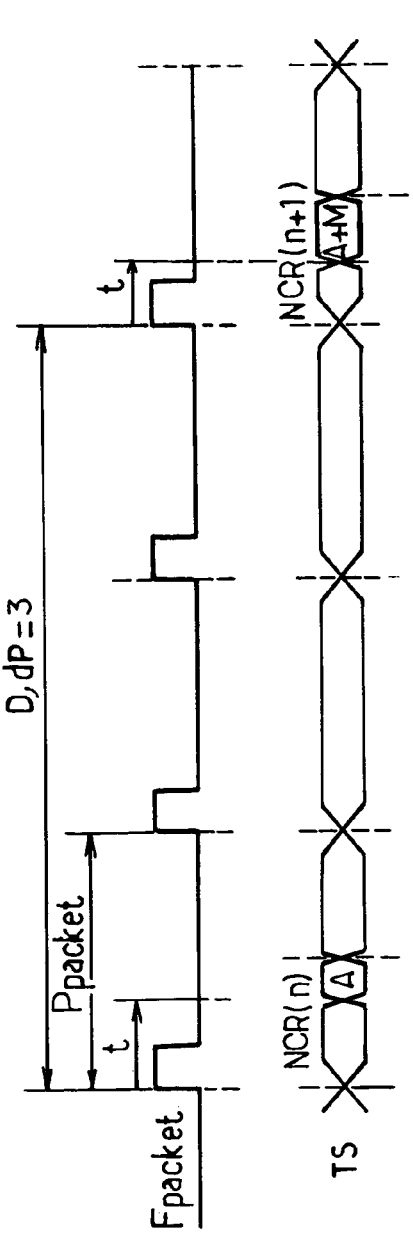
FIG.1a. FIG.1b. FIG.2a. FIG.2b. FIG.2c.

CLOCK RECOVERY CIRCUIT

CROSS-REFERENCE TO RELATED APPLICATIONS

This application is based upon and claims priority from French Patent Application No. 03-05565, filed May 7, 2003, the entire disclosure of which is herein incorporated by reference.

BACKGROUND OF THE INVENTION

The present invention relates to a circuit for clock recovery from a specified datastream, based on a digital Phase Locked Loop, which is also known as a digital PLL or DPLL.

The present invention finds applications, for example, in the terminals of a system for interactive digital telebroadcasting ("Digital Video Broadcasting" or "DVB"), in particular by satellite, by cable, or by terrestrial transmission, which terminals are also known as decoder boxes (or "Set-Top Boxes" or "STBs"). With the introduction of interactive services into these systems, STBs are thus becoming i-STBs ("Interactive STBs").

Several standards for the transmission of telebroadcast digital interactive information are currently known. For telebroadcasting by satellite, the following are known: the DVB-RCS ("DVB—Return Channel Satellite"), ESW ("EuroSkyWay"), ad HB6 ("Hot Bird 6") standards, and the iTV-RCS ("Interactive Television—Return Channel Satellite") standard for interactive television. For cable telebroadcasting, the following standards are known: DOCSIS ("Data Over Cable Services Interfaces Specifications"), and DVB-RCC ("DVB—Return Channel Cable"). For terrestrial telebroadcasting, the DVB-RCT ("DVB—Return Channel Terrestrial") standard is known.

The interactivity of the system is conveyed by a bidirectional channel between the source of telebroadcast data and the user terminal or the user terminals. From the point of view of the user terminal, this bidirectional channel comprises a downstream channel through which the telebroadcast signal is received, and an upstream channel or return channel for the transmission of a return signal. The telebroadcast signal contains downstream data, for example multimedia data corresponding to one or more audiovisual programs. The return signal contains upstream data, for example codes corresponding to votes with regard to a televised game, identification and/or payment data with regard to pay-per-view television, etc.

Further, a downstream interactive channel contains return signalling data allowing access to the interactive network and synchronization of the user terminals.

When the downstream interactive channel and the downstream payload channel are multiplexed on the same carrier, the application is said to be "In-Band" or IB. Such is the case for the DVB-RCS standard. When on the contrary the downstream interactive channel is not multiplexed with the downstream payload channel but follows a different physical path (for example via a data transmission network), the application is said to be "Out Of Band" or OOB. Such is the case for the DVB-RCC standard.

Among the aforesaid return signalling data, the downstream interactive channel transports an offset parameter that is referred to as the MAC_OFFSET parameter in the literature. This parameter allows each user terminal to clamp itself (temporally) onto the return channel with respect to the other user terminals of the interactive network, by compensating for the differences in remoteness between the various terminals. It may have a resultant composed of an integer number of symbols and of a symbol decimal part. In general, this parameter is related to the frame period of the downstream data flow.

All the standards cited above and generally all the standards envisaged in the exemplary applications of the present invention, provide for a packetized organization of the data in the various transport streams, for example using the MPEG2 ("Moving Pictures Expert Group 2") packets. The headers of these packets contain control information. In interactive applications where there is a distributed network clock, certain packets may contain an NCR ("Network Clock Recovery") field as is the case for the DVB-RCS, iTV-RCS and DVB-RCT standards based on MPEG2 downstream flow. The NCR field is present aperiodically in the downstream data flow. The values of the NCR field function to allow the user terminal to synchronize itself with the clock of the telebroadcasting network, with a view to allowing the processing of the data of the packet stream and to clocking the transmission of the upstream data over the return channel.

The transmission of upstream data symbols over the return channel is clocked by a transmission clock (or rather a time base). This time base must be generated in the user terminal from clock references contained in the downstream data flow received by the user terminal.

In fact, there are currently two types of recovery of the reference clock for the synchronization of the return channel, according to the standard of the telebroadcasting system. The first type affords recovery in periodic mode, and the second affords recovery in aperiodic mode.

The periodic mode is used for the ESW, HB6 and DVB-RCC standards. Recovery of the reference clock is performed according to a "frame-by-frame" method. This method involves establishing a simple relationship between the bit rate of the downstream channel and the bit rate of the return channel. For example, the downstream packet bit rate, the upstream symbol bit rate, etc., may be regarded as parameters. The following relationship may then be written:

$$Fout = \frac{P}{Q} \times Fin \qquad (1)$$

where:

Fin is in this example the frequency of the packets of the downstream flow;

Fout is in this example the bit rate of symbols of the upstream flow; and

P and Q are relatively prime integers.

The structure of the upstream data flow is organized into frames. The frame length is an integer multiple of the symbol period. The frame structure is temporally clamped, as a function of the MAC_OFFSET parameter.

The aperiodic mode is used for the DVB-RCS, NBI, DOCSIS and DVB-RCT standards. Recovery of the reference clock is performed according to a method known as the "NCR counter method". This method involves the following seven steps.

The values of the NCR fields NCR(n) are extracted from the packets of the downstream data flow, and they are stamped without introducing temporal jitter despite the aperiodic nature of the NCR fields. This stamping is carried out, for example, as a function of the PCR ("Program Clock Reference") information contained in the headers of the MPEG2 packets identified by a packet identifier or PID dedicated to the interactive service.

A local clock (or rather a local time base) is generated by locally overseeing a clock counter as a function of the stamped NCR(n) values (or "NCR stamp values"), in such a way as to minimize the error between the stamped NCR(n) values and the values of the local counter at the stamping instants.

The local clock is used to clamp the clocking of the terminal, taking account of the MAC_OFFSET offset parameter.

The local clock is used to synthesize the frequency of the symbols of the upstream flow.

The local clock is used to synthesize the carrier frequency of the return channel.

The local clock is used to organize and transmit the bursts of upstream data at specified respective instants.

And, there is generated a symbol string adjusted to the local clock, as well as the modulation carrier. The phase of the symbols should not exceed a given fraction of the period of the local clock within the limits of the burst. In certain cases, this may lead to the position of the burst being adjusted not only to an integer number of periods of the local clock but also to a fraction of the period of the local clock.

U.S. Pat. No. 6,072,369 discloses a network clock recovery circuit based on a DPLL. However, given its hardware design, this known circuit is specific to a specified broadcasting standard. It follows that such a circuit must be designed, manufactured and tested for each market standard. This increases the cost of the user terminals envisaged for a specified interactive telebroadcasting system and also the timescale for bringing them to the market.

SUMMARY OF THE INVENTION

In view of these drawbacks, it is an object of the present invention to overcome these drawbacks and to provide a circuit for recovering a reference clock in order to allow the synchronizing of a return channel.

Another object of the present invention is to provide a circuit for recovering a reference clock whose hardware structure is independent of the standard of the telebroadcasting system.

Yet another object of the present invention is to provide a circuit for recovering a reference clock that is compatible with the periodic and aperiodic modes.

One embodiment of the present invention provides a circuit for clock recovery from a specified datastream. The circuit includes a reference extraction unit for extracting from the datastream time references defining a reference time base, and a digital Phase Locked Loop coupled to the reference extraction unit. The digital Phase Locked Loop includes a first programmable counter in the guise of a digitally controlled oscillator for overseeing an output time base, a second programmable counter in the guise of a loop divider for overseeing a loop time base, and a dedicated processor capable of executing a program. The program includes a first software module in the guise of a phase comparator for comparing values of the loop time base and the reference time base and generating a loop error; and a second software module in the guise of a loop filter for producing an adaptation value of an increment value of the first programmable counter from the loop error.

Another embodiment of the present invention provides a method for clock recovery from a specified datastream. According to the method, time references defining a reference time base are extracted from the datastream. A first programmable counter is used to oversee an output time base, and a second programmable counter is used to overseeing a loop time base. V values of the loop time base and the reference time base are compared and a loop error is generated. An adaptation value of an increment value of the first programmable counter is produced from the loop error.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 1a and 1b are timing diagrams illustrating the relationship between the frequency of the local clock and the frequency of the reference clock in a periodic recovery mode;

FIGS. 2a, 2b and 2c are timing diagrams illustrating the relationship between the frequency of the local clock and the arising of the events in an aperiodic recovery mode;

DETAILED DESCRIPTION OF PREFERRED EMBODIMENTS

Figure 3:
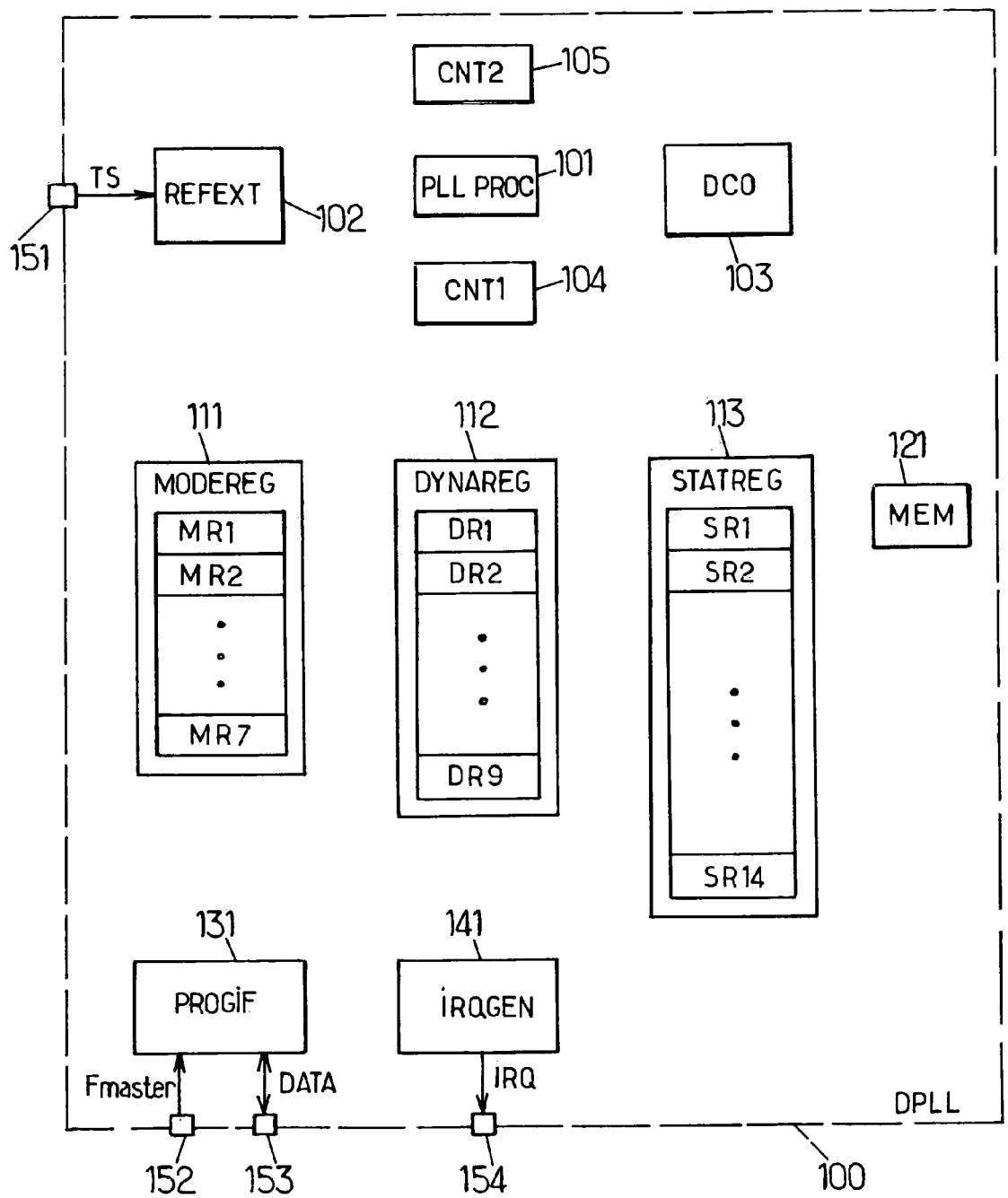
FIG. 3 is a block diagram illustrating a hardware architecture of a circuit according to one exemplary embodiment of the present invention.

The present invention is applicable to the recovery of a reference emitted classed as a stationary random process. Stated otherwise, the statistical features of the reference (e.g., mean, standard deviation) are independent of the time origin. However, such systems may give rise to slow slippages (for example slippage of the mean through the Doppler effect in the satellite case) characterized by a time constant of several hertz per unit time (e.g., second, minute, hour, day). The present invention is capable of coping with these slippages.

For this purpose, a preferred embodiment of the present invention provides a circuit for clock recovery from a specified datastream. The circuit comprises an extraction circuit for extracting from the datastream time references defining a reference time base, and a digital phase locked loop (or DPLL). The DPLL includes a first programmable counter in the guise of a digitally controlled oscillator for overseeing an output time base, a second programmable counter in the guise of a loop divider for overseeing a loop time base, and a dedicated processor that can execute a program. The program includes a first software module in the guise of a phase comparator for comparing the values of the loop time base and the reference time base and generating a loop error, and a second software module in the guise of a loop filter for producing an adaptation value of the increment value of the first programmable counter from the loop error.

Thus, the preferred circuit is designed with programmable hardware elements and with software elements, so that its hardware structure does not depend on the standard of the user terminals in which it is intended to be used. Because the processing times are fast with respect to the speed of evolution of the statistical features of the reference, the terminal has the necessary capacity to follow the reference with a delay which is negligible for the application, adapting its speed of reaction to that of the reference.

The fact that the software modules are executed by a dedicated processor also avoids interfacing with outside elements during operation, which interfacing would be specific to the standard in question (i.e., dedicated hardware, and therefore becoming complicated once several standards are covered).

Preferred embodiments of the present invention allow complete adaptability between the periodic type standards and the aperiodic type standards.

It will be noted that the concept of data flow according to the present invention is not limiting. It also encompasses a periodic signal, which therefore transports only the temporal information associated with its rising and/or falling edges.

The idea of the present invention can be extended to a multitude of sources by sharing the dedicated processor, thus allowing the recovery of several timing rates, with the proviso that the dedicated processor has sufficient available time intervals.

According to another advantage of the present invention, the digital representation of the reference Fin of the reference time base makes it possible to generate, in addition to the frequency Fout of the output time base, other digital references such as the symbol frequency, the intermediate frequency, or the carrier frequency of the uplink.

In one embodiment, the first software module is adapted for performing, each time a reference is extracted from the datastream, a partial calculation of the type:

$$k_n \times \frac{P}{Q} [P]$$

where:
P and Q are relatively prime integers,
$k_n = k_n + 1$ with $k_0 = 1$, and
the result is taken modulo P (denoted [P] in standard fashion).

This makes the convergence time of the DPLL independent of the numbers P and Q, and of the ratio P/Q.

Preferably, the first programmable counter comprises a first output delivering the integer part of the output time base, and a second output delivering the decimal part of the output time base.

This offers a solution allowing fine adjustment of the terminal positions (below the level of the symbol). Specifically, the output time base defined by these two outputs makes it possible to carry out a direct interpolation between the speed of the symbols and the frequency of sampling of these symbols at the output of the uplink.

In preferred embodiments, the circuit is clocked entirely by a single clock signal having a specified frequency.

Exemplary embodiments of the present invention will now be described in detail with reference to FIGS. 1a-5.

The circuit according to preferred embodiments of the present invention, which is based on a DPLL, functions to oversee in the periodic mode a programmable local clock, or rather a programmable local time base, of fractional type P/Q, where P and Q are integers, on the basis of time references contained in the transport stream received by the user terminal in which it is arranged. In the case of the aperiodic mode, the ratio P/Q is more widely expressed as a ratio of two real numbers whose result is a real number. This amounts to recovering a reference clock intrinsically contained in the transport stream (in the case of recovery in periodic mode), or the values explicitly transmitted in aperiodic manner in the stream (in the case of recovery in aperiodic mode).

In periodic mode, the local clock can directly pace the uplink, its frequency Fout, corresponding to a fraction P/Q of the frequency Fin of the reference clock, constitutes a multiple or a submultiple of the symbol frequency and thereby of an uplink frame frequency.

In aperiodic mode, the local clock corresponds to a time base, or rather a local NCR counter, used to hook the packets of the uplink, these having their own transmission frequency. In order to initialize the loop, the frequency of the local NCR counter is estimated by a first ratio:

$$Fncr \approx \frac{P}{Q} \times Fin$$

where Fin is the frequency of the MPEG2 packets. Subsequently the ratio P/Q evolves and is no longer necessarily a ratio of two relatively prime integers; it is calculated in floating precision by virtue of an embedded microprocessor. For example, the first ratio P/Q can correspond to a multiplicative factor k equal to unity, and subsequently this multiplicative factor k can evolve and be described with a decimal precision of $2^{-63}$.

In interactive MPEG applications, the local clock then corresponds to the network clock.

It is recalled that the assumption is made that the time references are stationary and ergodic. Stated otherwise, over separate time intervals, they have the same mean and the same standard deviation. Moreover, their time constant can be regarded as large compared with the frequency of operation of the DPLL circuit.

FIGS. 1a and 1b represent an example of timing diagrams showing the relationship between the reference clock at the frequency Fin (FIG. 1a) and the local clock at the frequency Fout (FIG. 1b), in the case of clock recovery in periodic mode.

The frequency Fin is, for example, the frequency of the packets in MPEG applications. It may also be the frequency of the frame markers which are transmitted in OOB applications such as applications conforming to the DVB-RCC standard. The frequency Fout is, for example, the frequency of the symbols of the upstream data flow (in the return channel), or the frequency of the bits of this flow. In these examples, the term "event" is understood to mean, respectively, the start of a packet or the occurrence of a marker in the OOB flow. Moreover, the expression "time reference" is understood to mean the instant at which the packet or the marker, respectively, is received.

It is recalled that, in the periodic mode, the bit rates of the uplink and the downlink are related by a fixed relationship. It follows that the frequencies Fin and Fout are also related by a fixed relationship, here of fractional type:

$$Fout = \frac{P}{Q} \times Fin \qquad (1)$$

where P and Q are relatively prime fixed integers.

This relationship is illustrated by the timing diagrams of FIGS. 1a and 1b in an example where P=5 and Q=2.

The timing diagrams of FIGS. 2a to 2c illustrate the case of clock recovery in aperiodic mode.

The practical application of the aperiodic mode is the recovery of the network clock in interactive MPEG applications. Stated otherwise, the DPLL circuit has the objective of locally recovering a continuous clock (local NCR counter) which is locked to the network clock. The difficulty stems from the fact that the network clock is not delivered continuously in the transport stream, but is delivered aperiodically. In this mode, the term "event" is understood to mean the reception of an NCR field in the transport stream. Moreover, the "time references" are directly the network clock values received in the NCR field. In this case the speed of convergence of the DPLL is dependent on the frequency of the NCR fields present in the transport stream.

In what follows, "D" denotes the temporal distance between two successive events. Moreover, "Ppacket" denotes the period of the MPEG packets, which is a constant. We then have the following relationship:

$$D = dP \times P\text{packet} \quad (2)$$

where dP is a variable integer which is equal to the number of packet periods included between two successive events. The parameter dP must be measured at each event with a packet counter.

It will be noted that the parameter dP can also be involved in the periodic mode if, instead of considering all the events, one event every dP is considered. The parameter dP is then involved as an additional factor in relationship (1) given above.

In aperiodic applications, the frequency Fin cannot be defined as in periodic applications, because the term 1/D is variable from one event to another. However, a reduced frequency Fin_r, which is a constant, is given by:

$$\text{Fin\_r} = \frac{dP}{D} = F\text{packet} \quad (3)$$

where Fpacket is the frequency of the packets (that is to say the inverse of Ppacket).

The output frequency Fncr is equal to the frequency of the network clock and is related to Fpacket as in the periodic mode. Nevertheless, the frequency Fncr must be approximated using the following formula, so as to normalize the measure of the phase error:

$$F\text{ncr} \approx \frac{P}{Q} \times F\text{packet} \quad (4)$$

where P and Q are relatively prime integers.

The timing diagrams show the relationships between the frequency Fpacket (FIG. 2a), the occurrence in the transport stream TS of successive NCR fields NCR(n) and NCR(n+1) of respective values A and A+M (FIG. 2b), and the output frequency Fncr (FIG. 2c), when P=8 and Q=3. In the portion represented, the gap dP between two NCR fields corresponds to three packets (dP=3). In general, this gap is variable and imposed on the DPLL circuit by the characteristics of the transport stream TS.

Here, it is assumed that the NCR fields are received after a fixed duration t following the start of the packet in which they are transmitted. This simplifies the hardware structure of the DPLL circuit since it suffices to implement a packet counter to produce the value of the parameter dP necessary to evaluate the value of D. If the stream containing the time references is not organized into packets, then the value of D must be evaluated by a high-frequency counter having a sufficiently high temporal precision. It will be noted however that in all the standards envisaged for the exemplary applications of the present invention, the transport stream has a packetwise organization, so that this case does not arise in the exemplary applications.

FIG. 3 is a block diagram illustrating a hardware architecture of a circuit according to an exemplary embodiment of the present invention.

From the hardware point of view, the circuit 100 comprises a dedicated processor 101, a local memory 121, a programmable interface unit 131, an interrupt generation unit 141, data registers which may be grouped into three units or banks of separate registers 111, 112 and 113, a reference extraction unit 102, a digitally controlled oscillator 103 (or DCO), a first counter 104, and a second counter 105.

For the sake of clarity, the data exchanges between the various hardware units of the circuit 100 are not shown in the figure.

The circuit 100 is intended to be used in a user terminal belonging to a specified telebroadcasting system, conforming to a specified telebroadcasting standard, such as one of those cited above.

The circuit 100 comprises an input 151 for receiving a transport stream TS or any other reference signal, for example a stream of OOB frame markers for the DVB-RCC standard, or any periodic signal. The TS stream is supplied to the reference extraction unit 102.

The circuit 100 also comprises an input 152, coupled to the programmable interface unit 131, for receiving a high-frequency clock signal Fmaster. The frequency Fmaster is the unique clocking frequency of the circuit 100. It is assumed that the time constant of the time references contained in the transport stream TS is very large compared with this clocking frequency. This distinguishes the DPLL circuit of the present invention from a PLL circuit conventionally used, for example, for the demodulation of a radiofrequency signal. For the exemplary applications, a good value of the frequency Fmaster is a value above 100 MHz, for example 135 MHz.

The circuit 100 furthermore comprises an input/output 153, also coupled to the programmable interface unit 131, for receiving data from and/or delivering data to a control circuit.

Additionally, the circuit 100 comprises an output 154, coupled to the interrupt generation unit 141, for delivering an interrupt signal IRQ according to certain circumstances. The blocks and signals 131, 141, 153, and 154 constitute the user interface.

The data registers may be functionally grouped together as a function of the nature of the information that they contain. For example, in this embodiment the bank of registers 111 comprises seven registers MR1 to MR7 for storing "mode" information, the bank of registers 112 comprises nine registers DR1 to DR9 for containing "dynamic" data, and the bank of registers 113 comprises fourteen registers SR1 to SR14 for containing "static" data.

The memory 121 is a random access memory (RAM) comprising for example a program memory on the order of 12 Kbits as well as a data memory of about 4 Kbits. Before the DPLL circuit starts up, the memory unit 121 is loaded by a host processor through the interface unit 131. For example, a pilot program is loaded to the program memory.

At each event, the information stored in the bank of registers 112 is automatically copied into the data memory of the memory unit 121. The information stored in the bank of registers 113 is copied into this data memory as a function of a software decision based on the value stored in one of the registers of the bank of registers 112, for example the register DR9. These measures allow the processor 101 to be informed of the state of the DPLL.

The DPLL circuit manages just one of the periodic and aperiodic modes, as a function of the value stored in one of the registers of the bank of registers 111, for example the register MR3.

The reference extraction unit 102 functions, in the periodic mode and in the aperiodic mode, to stamp the events, that is to say to date them and to supply this data to the remainder of the circuit without insertion of jitter, and hence to start up the calculation procedure delivering the new frequency to be applied to the DCO 103. In the aperiodic mode, it also functions to supply the current value NCR(n) of the NCR field.

Figure 4:
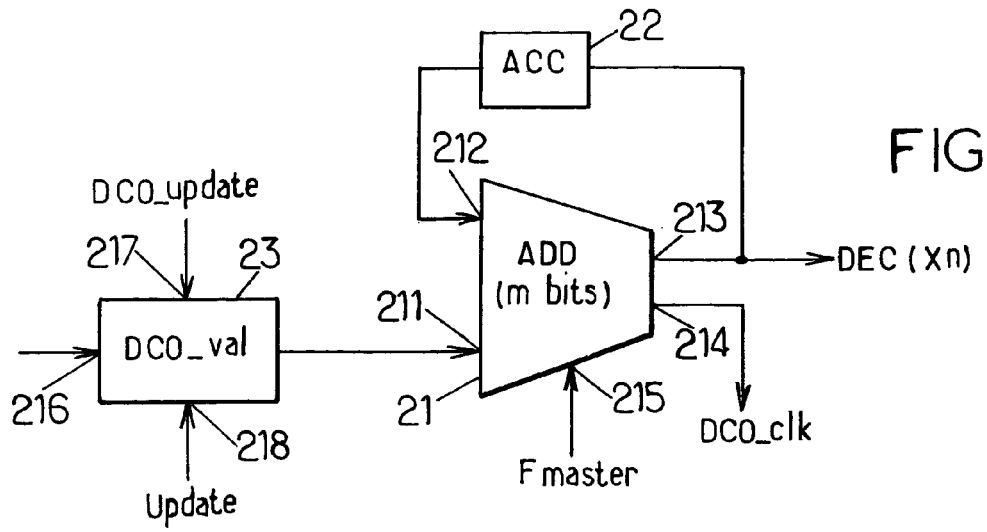
FIG. 4 is a diagram of a DCO of a circuit according to one exemplary embodiment of the present invention.

FIG. 4 illustrates an exemplary embodiment of a DCO that is suitable for forming the unit 103 of FIG. 3. It is recalled that this unit delivers the local time base at the frequency Fout.

In this example, the local time base is defined at each instant by the current value of an N-bit counter, that is to say a counter modulo $2^N$, where N is a specified integer. For example, N=64. The number N is for example stored in the register SR4.

The DCO comprises for example an N-bit adder 21, a first input 211 of which receives an increment value DCO_val and a second input 212 of which is coupled to its output 213 via an accumulator 22. The increment value DCO_val is stored in a register 23 of the DCO. It is updated with the value presented on an input 216 of the register 23 when a first update signal DCO_Update is delivered on a first refresh input 217 of the register 23 and when a second update signal Update is delivered on a second refresh input 218 of this register. The first update signal DCO_Update is activated by the second counter 105, and the second update signal Update is activated by the processor 101. This signal occurs after a constant interlude which can be programmed with respect to the time of receipt of the event delivered by the reference extraction unit 102.

The adder 21 furthermore comprises an overflow output 214, or carry output, delivering a signal DCO_clk which exhibits a pulse with each overflow of the adder.

Additionally, the adder is clocked by the operating signal of the DPLL circuit at the frequency Fmaster, which is received on an activation input 215.

Denoting by $X_n$ the accumulated count value of the DCO (since the circuit was set going), it is understood that the output 213 delivers a value $DEC(X_n)$ corresponding to the remainder (or decimal part) after dividing the number $X_n$ by the number $2^N$, while the output 214 delivers a clock signal DCO_clk corresponding to the adder 21 overflow signal, the frequency of which is determined by the increment value DCO_val supplied on the input 211.

The principle of operation of the circuit involves adapting the increment value DCO_val of the DCO in such a way as to slave the local time base. For this purpose, the processor 101 generates a new value DCO_val with each event. The local time base is defined by the signal DCO_clk whose period corresponds to an integer number of symbols of the transport stream TS, and by the value $DEC(X_n)$ corresponding to a symbol decimal part.

Advantageously, by taking the value $DEC(X_n)$ into account for the temporal clamping of the packets transmitted in the return channel, it is possible to carry out this clamping with a precision of less than the temporal length of a symbol, based on the value of the parameter MAC_OFFSET received by the terminal in the transport stream TS.

Figure 5:
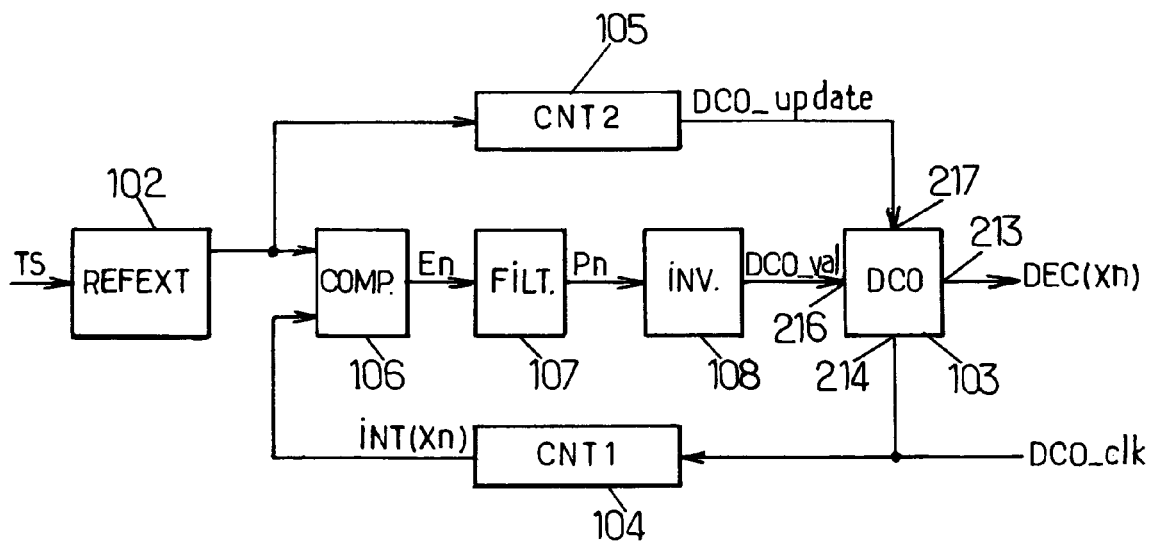
FIG. 5 is a functional diagram of a circuit according to a preferred embodiment of the present invention.

The diagram of FIG. 5, on which the same elements as in FIG. 3 bear the same references, is a functional layout of the circuit according to a preferred embodiment of the present invention.

It is recalled that the circuit 100 functions to oversee the local time base by delivering the signal DCO_clk at the frequency Fout as well as the value $DEC(X_n)$ on the basis of the data received in the transport stream TS.

Upstream of the DCO 103, the DPLL comprises a phase comparison module 106, a digital filtering module 107 and an inversion module 108. The phase comparison module 106 operates in the guise of a phase comparator for the DPLL. Moreover, the digital filtering module 107 operates in the guise of loop filter for the DPLL. Additionally, the inversion module 108 embodies the interface between the output of the inversion module 107 which delivers a new value of the period $P_n$ (dimensionally equivalent to a time), and the input 216 of the register 23 of the DCO which receives the increment value DCO_val (dimensionally equivalent to a frequency).

The signal DCO_clk delivered by the output 214 of the DCO is transmitted as input to the first counter 104, which operates in the guise of a loop divider for the DPLL. This is a counter modulo P. Thus, this counter is incremented with each overflow of the adder of the DCO. At the output, it therefore delivers a value $INT(X_n)$ corresponding to the quotient (or integer part) after dividing the number $X_n$ by the number $2^N$, modulo P.

A first input of the comparison module 106 is coupled to the output of the reference extraction unit 102. A second input of the comparison module 106 is coupled to the output of the first counter 104. The output of the comparison module 106 delivers a value En, which is dimensionally equivalent to a phase error.

The input of the second counter 105 is also coupled to the output of the reference extraction unit 102, and its output is coupled to the input 217 for updating the increment value of the DCO 103.

The modules 106, 107 and 108 are embodied in the form of software modules, which are executed by the processor 101 according to an instruction sequence dictated by the writing of the pilot program that is executed by this processor.

Thus, the circuit may be fully programmed as a function of the application concerned. In particular, a binary information item defining the periodic or aperiodic mode of recovery is stored, for example, in the register MR3. Moreover, the values P and Q are stored in respective registers, for example the registers SR2 and SR3. Likewise the initial value of the increment value DCO_val of the DCO is stored, for example, in the register SR13. Furthermore, the processing implemented by the pilot software is specific to the periodic or aperiodic mode of clock recovery. Likewise, this processing depends on the nature of the events which are considered for this recovery.

An example of processing in the case of clock recovery in periodic mode will now be described. This mode is activated when, for example, the binary value stored in the register MR3 is 0. In the example considered here, the time references correspond to the instants of arrival of the MPEG packets.

The reference extraction unit 102 extracts these time references while stamping the MPEG packets, and delivers one such reference to the comparator 106 every dP references, where dP is an integer, which is stored for example in the register SR14. Stated otherwise, only one time reference every dP wakes up the state machine constituted by the DPLL. In what follows, the index n refers to the state of the variables during the processing of a specified event. With regard to the periodic mode, normally dP=1 unless the processing time of the processor 101 is greater than Pin, where Pin designates the inverse of Fin, that is to say the period of the references, in which case the parameter dP is increased until Pin is greater than the processing time.

In the case where dP=1, the stamping takes place at the rate Fin although the output frequency is:

$$Fout = \frac{P}{Q} \times Fin \qquad (1)$$

It will be noted that, in a conventional hardware solution, a divider by Q is placed at the head of the comparator module 106 (a divider by P being placed in the return path of the loop), so that the rate of stamping is Fin/Q. Hence, a calculation is performed after waiting Q times the period Pin. It follows that the convergence time is related to Q, and may become very inconvenient or even unacceptable for the application when Q becomes large.

On the contrary, with the present invention there is no such divider by Q. Also, the comparator module 106 is adapted to perform, each time a reference is extracted from the datastream by the reference extraction unit 102, a partial calculation of the type:

$$k_n \times \frac{P}{Q}[P] \qquad (5)$$

where:

P and Q are relatively prime integers, $k_n = k_n + 1$ with $k_0 = 1$, and the result is taken modulo P (denoted [P] in standard fashion).

Stated otherwise, at each period Pin, the advancement of the ratio P/Q is calculated. The convergence time of the DPLL is therefore constant, regardless of the values of P and Q, and regardless of the value of the ratio P/Q.

Each time, the values stored in the registers of the bank of registers 112 are copied into the data memory of the memory unit 121, so as to let the processor 101 know the instantaneous state (hereinbelow labelled by the index n) of the DPLL. Moreover, the second counter 105 is started up. When a specified count value is reached, the second counter 105 delivers the signal DCO_Update which orders the updating of the increment value DCO_val of the DCO 103. The count value is stored, for example, in the register MR1.

The comparator module 106 (see FIG. 5) then proceeds to calculate the phase error En, or loop error. In fact, this error is the difference between the number (divided by P owing to the first counter 104) of periods of the local clock between two considered events, which number is reconstructed by the loop, and the integer number, divided by Q, of symbols between two such events.

For reasons of dimensional equivalence of the values compared, the module 106 first calculates, at each event taken into account, the remainder $R_n$ of the Euclidean division of P by Q, which is given by:

$$R_n = (P \times dP + R_{n-1}) - (D_n \times Q) \qquad (6)$$

where:

dP is the number of packets between two considered events;

$D_n$ is an integer (dividend);

P and Q are fixed integers; and $R_0 = 0$ (when the DPLL circuit is set going).

Moreover, the remainder $R_n$ must be expressed in the base $2^N$ which is that of the NCO, so $R_n$ is converted into a value $R'_n$ such that:

$$R'_n = 2^N \times \frac{R_n}{Q} \qquad (7)$$

The loop error is then calculated by subtracting real numbers, that is to say by taking account of the decimal part and then the integer part with a possible carry of the decimal part, of each of the counters. Stated otherwise, the error En is given by:

$$E_n = (D_n, R'_n) - \left(\frac{INT(X_n)}{P}, DEC(X_n)\right) \qquad (8)$$

where, in this notation, the first element of each pair of the right-hand side of the equality designates the integer part whereas the second element designates the decimal part.

It will be noted that, for the calculation of the current value of the loop error $E_n$, any overflows of the first counter 104 must be taken into account.

In one particular embodiment, the processor 101 executes an error validation step. This step involves keeping the current value of the increment value DCO_val if the error is less than a specified threshold. Untimely modification of the balance of the DPLL is thus avoided. The value of this threshold is for example stored in the register SR5. In another particular embodiment, provision is also be made for the processor 101 to determine whether the DPLL is or is not locked, for example by considering the number of times that the error $E_n$ is successively below a threshold. This threshold is for example stored in the register SR6, and the number in question is for example stored in the memory. This number is then compared with a specified high threshold and specified low threshold, according to a hysteresis comparison, so as to decide whether the DPLL is or is not locked. These thresholds are for example stored in the registers SR8, SR9 and SR10, respectively. The locked or unlocked state of the DPLL is then signalled to the exterior of the circuit by a semaphore mechanism or the like.

In a following step, which is for example implemented by the filtering module 107, the error En is normalized so as to obtain the error $E'_n$ which exists at each period of the local clock. This is carried out by calculating $$E'_n = \frac{E_n}{dP} \times \frac{P}{Q} \qquad (9)$$

It will be noted that, in general, the parameter dP will be equal to unity. We shall choose dP>1 when the calculation time for the new value DCO_val may be greater than the time interval between two successive events.

In a following step, also implemented in the filtering module 107, the new period $P_n$ of the local clock is calculated, this being used for the adaptation of the increment value of the DCO 103.

In one example, this is carried out with a first-order digital filter, for example such that:

$$T_n = T_{n-1} - (B \times E'_n) \qquad (10)$$

$$P_n = T_N - (A \times E'_n) \qquad (11)$$

where:

$T_n$ is an internal variable which represents the error $E'_n$ integrated with a specified time constant; and A and B are values stored, for example, in the registers SR11 and SR12, respectively.

Relation (9) introduces an integral correction whereas relation (10) introduces a proportional correction. The values A and B may be determined in the development phase by simulating the operation of the loop and choosing a natural oscillation frequency and a natural damping factor for the DPLL.

In a last calculation step, it is advisable to calculate the inverse of $P_n$ (which is dimensionally equivalent to a duration) to obtain the value NCO_val (which is dimensionally equivalent to a frequency). This is carried out by the following calculation:

$$DCO\_val = \frac{1}{P_n} \quad (12)$$

This calculation is for example implemented in the inversion module 108. As a variant, it may also be integrated with the calculations implemented in the filtering module 107. In this case, the inversion module 108 does not exist as such.

The new value DCO_val is written to the register 23 of the DCO when the signal DCO_Update generated by the second counter 105 and when the signal Update generated by the processor 101 are active.

The processing implemented by the pilot program of the DPLL circuit will now be described in the case of clock recovery in aperiodic mode. In the example considered here, the time references correspond directly to the values of the NCR fields, which reflect the network clock of the telebroadcasting system.

In this mode, which is activated for example when the binary value stored in the register MR3 is 1, the reference extraction unit 102 extracts the values NCR(n) of at least certain of the NCR fields contained in the TS stream.

The various components of the value NCR(n) are stored in registers of the bank of registers 112, for example the registers DR1 to DR3. More precisely, the value NCR(n) may be expressed as indicated in the MPEG-2 standard No.13818-1, namely:

$$NCR(n)=NCR\_base(n) \times 300 + NCR\_ext(n),$$

where:

$$NCR\_base(n) = \left(\frac{system\_clock\_frequency \times t(n)}{300}\right) modulo\ 2^{33};$$

NCR_ext(n)=system_clock frequency×t(n) modulo 300;

t(n) is the time stamp associated with the current value NCR(n) of the NCR field; and, system_clock_frequency=27 MHz.

For example, the value NCR_ext(n) is stored in the register DR1, the value NCR_base(n) is stored in the register DR2, and the number of overflows of the value NCR_base(n) is stored in the register DR3.

Further, in the aperiodic mode, the parameter dP is not fixed but it is imposed by the structure of the TS stream. The value of the parameter dP is calculated at each event by a packet counter of the module 102, as was stated above with regard to the timing diagrams of FIGS. 2a to 2c. It is then supplied to the module 106.

The time references being directly dimensionally equivalent to the values given by the local time base, it will be noted that, for the calculation of the loop error, the operations defined by relations (6) and (7) above are not necessary, and hence the corresponding steps of the method are not implemented.

It will be noted further that the loop counter 104 is programmed in a manner specific to the mode of recovery of the reference clock.

Accordingly, it is essentially the phase comparison module 106 and the counter 104 forming a loop divider that are specific to the mode of recovery of the reference clock.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A circuit for clock recovery from a specified datastream, the circuit comprising:
    a reference extraction unit for extracting from the specified datastream time references defining a reference time base; and
    a digital Phase Locked Loop coupled to the reference extraction unit, the digital Phase Locked Loop including:
        a first programmable counter operating as a digitally controlled oscillator for generating an output time base;
        a second programmable counter operating as a loop divider for generating a loop time base; and
        a dedicated processor capable of executing a program, the program comprising:
            a first software module for operating as a phase comparator and comparing values of the loop time base and the reference time base and generating a loop error; and
            a second software module for operating as a loop filter and producing an adapted increment value for the first programmable counter from the loop error, the adapted increment value being coupled to an increment value input of the first programmable counter,
        wherein the first software module performs, each time one of the time references is extracted from the specified datastream, a partial calculation of the type:

$$k_n \times \frac{P}{Q}[P]$$

where P and Q are relatively prime integers,
$k_n = k_n + 1$ with $k_0 = 1$, and
the result is taken modulo P.

2. The circuit according to claim 1, wherein the first programmable counter comprises a first output that delivers an integer portion of the output time base, and a second output that delivers a decimal portion of the output time base.

3. A circuit for clock recovery from a specified datastream, the circuit comprising:
 a reference extraction unit for extracting from the specified datastream time references defining a reference time base; and
 a digital Phase Locked Loop coupled to the reference extraction unit, the digital Phase Locked Loop including:
  a first programmable counter operating as a digitally controlled oscillator for generating an output time base;
  a second programmable counter operating as a loop divider for generating a loop time base; and
  a dedicated processor capable of executing a program, the program comprising:
   a first software module for operating as a phase comparator and comparing values of the loop time base and the reference time base and generating a loop error; and
   a second software module for operating as a loop filter and producing an adapted increment value for the first programmable counter from the loop error, the adapted increment value being coupled to an increment value input of the first programmable counter,
  wherein the reference extraction unit, the first programmable counter, the second programmable counter, and the dedicated processor are all clocked by a single clock signal having a specified frequency.

4. The circuit according to claim 3, wherein the first programmable counter comprises a first output that delivers an integer portion of the output time base, and a second output that delivers a decimal portion of the output time base.

5. The circuit according to claim 3, wherein the first programmable counter includes an adder and a register coupled to an input of the adder, the register storing the increment value of the first programmable counter.

6. The circuit according to claim 5, wherein the adapted increment value is supplied to the register of the first programmable counter.

7. The circuit according to claim 3,
 wherein the second software module, operating as the loop filter, uses the loop error to produce a new period value for the output time base, and
 the second software module, operating as an inversion module, uses the new period value for the output time base to produce the adapted increment value.

8. The circuit according to claim 3, wherein the first programmable counter outputs a digital clock signal consisting of an integer portion of the output time base.

9. The circuit according to claim 3, wherein the digital Phase Locked Loop does not include a voltage controlled oscillator.

10. A user terminal for an interactive telebroadcasting system, the user terminal including at least one circuit for clock recovery from a specified datastream, the circuit comprising:
 a reference extraction unit for extracting from the specified datastream time references defining a reference time base; and
 a digital Phase Locked Loop coupled to the reference extraction unit, the digital Phase Locked Loop including:
  a first programmable counter operating as a digitally controlled oscillator for generating an output time base;
  a second programmable counter operating as a loop divider for generating a loop time base; and
  a dedicated processor capable of executing a program, the program comprising:
   a first software module operating as a phase comparator for comparing values of the loop time base and the reference time base and generating a loop error; and
   a second software module operating as a loop filter for producing an adapted increment value for the first programmable counter from the loop error, the adapted increment value being coupled to an increment value input of the first programmable counter,
  wherein the reference extraction unit, the first programmable counter, the second programmable counter, and the dedicated processor are all clocked by a single clock signal having a specified frequency.

11. The user terminal according to claim 10, wherein the first software module performs, each time one of the time references is extracted from the specified datastream, a partial calculation of the type:

$$k_n \times \frac{P}{Q}[P]$$

where P and Q are relatively prime integers,
$k_n = k_n + 1$ with $k_0 = 1$, and
the result is taken modulo P.

12. The user terminal according to claim 11, wherein the first programmable counter comprises a first output that delivers an integer portion of the output time base, and a second output that delivers a decimal portion of the output time base.

13. The user terminal according to claim 10, wherein the first programmable counter comprises a first output that delivers an integer portion of the output time base, and a second output that delivers a decimal portion of the output time base.

14. A method for clock recovery from a specified datastream, the method comprising the steps of:
 extracting from the specified datastream time references defining a reference time base;
 using a first programmable counter to generate an output time base;
 using a second programmable counter to generate a loop time base;
 comparing values of the loop time base and the reference time base and generating a loop error;
 producing an adapted increment value for the first programmable counter from the loop error; and
 supplying the adapted increment value to an increment value input of the first programmable counter,
 wherein the comparing step includes a sub-step of performing, each time one of the time references is extracted from the specified datastream, a partial calculation of the type:

$$k_n \times \frac{P}{Q}[P]$$

where P and Q are relatively prime integers,
$k_n = k_n + 1$ with $k_0 = 1$, and
the result is taken modulo P.

15. The method according to claim 14, wherein the step of using the first programmable counter includes sub-steps of:
 delivering an integer portion of the output time base at one output of the first programmable counter; and delivering a decimal portion of the output time base at another output of the first programmable counter.

16. A method for clock recovery from a specified datastream, the method comprising the steps of:
    extracting from the specified datastream time references defining a reference time base;
    using a first programmable counter to generate an output time base;
    using a second programmable counter to generate a loop time base;
    comparing values of the loop time base and the reference time base and generating a loop error;
    producing an adapted increment value for the first programmable counter from the loop error;
    supplying the adapted increment value to an increment value input of the first programmable counter; and
    clocking all portions of a circuit that performs the method with a single clock signal having a specified frequency.

17. The method according to claim 16, further comprising the step of using a dedicated processor to execute a program that performs the comparing and producing steps.

18. The method according to claim 16, wherein a dedicated processor is programmed to perform the comparing and producing steps.

19. The method according to claim 16, wherein the step of using the first programmable counter includes sub-steps of:
    delivering an integer portion of the output time base at one output of the first programmable counter; and
    delivering a decimal portion of the output time base at another output of the first programmable counter.

* * * * *